US008208281B2

(12) United States Patent
Choi et al.

(10) Patent No.: US 8,208,281 B2
(45) Date of Patent: Jun. 26, 2012

(54) SEMICONDUCTOR DEVICES SUPPORTING MULTIPLE FUSE PROGRAMMING MODES

(75) Inventors: Hyunsu Choi, Suwon-si (KR); Jung-Hak Song, Seoul (KR); Jungmin Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 326 days.

(21) Appl. No.: 12/652,272

(22) Filed: Jan. 5, 2010

(65) Prior Publication Data

US 2010/0214816 A1 Aug. 26, 2010

(30) Foreign Application Priority Data

Feb. 25, 2009 (KR) ........................ 10-2009-0015931

(51) Int. Cl.
*G11C 17/00* (2006.01)
(52) U.S. Cl. .................... 365/96; 365/225.7; 365/189.12
(58) Field of Classification Search .................... 365/96, 365/225.7, 189.12
See application file for complete search history.

(56) References Cited

U.S. PATENT DOCUMENTS

| 7,622,982 | B2 * | 11/2009 | Nishihara et al. ............. 327/525 |
| 2005/0249014 | A1 * | 11/2005 | Chung ........................ 365/225.7 |
| 2006/0294059 | A1 * | 12/2006 | Chamberlain et al. ............ 707/3 |
| 2007/0058411 | A1 * | 3/2007 | Sumi et al. ..................... 365/96 |
| 2008/0043551 | A1 * | 2/2008 | Yamaguchi .................. 365/200 |
| 2011/0317804 | A1 * | 12/2011 | Kurjanowicz ................... 377/78 |

FOREIGN PATENT DOCUMENTS

| JP | 08-008726 | 1/1996 |
| JP | 2005-063535 | 3/2005 |

* cited by examiner

*Primary Examiner* — Fernando N. Hidalgo
(74) *Attorney, Agent, or Firm* — Myers Bigel Sibley & Sajovec, P.A.

(57) ABSTRACT

Semiconductor devices include a plurality of fuses and a plurality of program circuits, respective ones of which are configured to program respective ones of the plurality of fuses. The devices further include a shift register configured to activate at least two of the program circuits. In some embodiments, the shift register includes a first shift register configured to generate first select signals and a second shift register configured to generate second select signals corresponding to data to be programmed to the plurality of fuses. Respective ones of the program circuits may be configured to program respective ones of the fuses responsive to respective pairs of the first select signals and the second select signals.

14 Claims, 7 Drawing Sheets

SEMICONDUCTOR DEVICES SUPPORTING MULTIPLE FUSE PROGRAMMING MODES

CROSS-REFERENCE TO RELATED APPLICATIONS

This U.S. non-provisional patent application claims priority under 35 U.S.C. §119 of Korean Patent Application No. 10-2009-0015931, filed on Feb. 25, 2009, the entire contents of which are hereby incorporated by reference.

BACKGROUND

The present invention relates to electronic devices and, more particularly, to fuse programmable semiconductor devices.

Fuse option circuits are used for various purposes in semiconductor integrated circuits. For example, fuse option circuits are widely used for storage of chip ID (identification), repair of a defect cell of a semiconductor memory, and voltage trimming for setting an optimum internal voltage.

Techniques for programming fuse option circuits include laser blowing and electric blowing. Laser blowing typically involved blowing fuses using a laser beam. Electric blowing typically involves changing a resistance value of a fuse by applying a certain amount of current to the fuse. Electric blowing may be used even after chip packaging using what is called an electrical fuse (e-fuse) method. A fuse Read Only Memory (ROM) is typically programmed in a test procedure, not during the fabrication process or by the end user of the device. Accordingly, the amount of data programmed in the fuse ROM may be limited.

SUMMARY

Some embodiments of the inventive subject matter provide semiconductor devices including a plurality of fuses and a plurality of program circuits, respective ones of which are configured to program respective ones of the plurality of fuses. The devices also include a shift register configured to activate at least two of the program circuits. In some embodiments, the shift register includes a first shift register configured to generate first select signals and a second shift register configured to generate second select signals corresponding to data to be programmed to the plurality of fuses. Respective ones of the program circuits may be configured to program respective ones of the fuses responsive to respective pairs of the first select signals and the second select signals. More particularly, the plurality of program circuits may be configured to program the plurality of fuses in response to the first select signals, the second select signals and a program control signal.

According to further embodiments, the semiconductor device may include a control circuit configured to control the first and second shift registers. The control circuit may be configured to cause the first shift register to assert all of the first select signals to enable fuse programming by the program circuits and to cause the second shift register to selectively assert the second select signals in sequence responsive to data shifted therethrough to selectively program the fuses one at a time. In further embodiments, the control circuit may be configured to cause the first shift register to shift data input thereto to selectively assert the first select signals in sequence to program at least two of the program circuits at a time. The control circuit may be configured to load a sequence of data into the second shift register prior to shifting data through the first shift register and to maintain the loaded data in the second shift register during shifting of data through the first shift register.

The control circuit may include a decoder configured to select one of the fuses in response to address signals and a sense amplifier configured to sense data stored in the one selected fuse. Two of the address signals may include an input data signal and a clock signal provided to the first shift register.

According to additional embodiments, a semiconductor device may include a plurality of fuses, a first shift register configured to generate a plurality of first select signals, a second shift register configured to generate a plurality of second select signals and a plurality of program circuits, respective ones of which are configured to receive respective ones of the first select signals and respective ones of the second select signals and configured to program respective ones of the fuses responsive thereto.

The program circuits may be configured to selectively conduct program current through the fuses responsive to the first and second select circuits. For example, the program circuits may be configured to selectively connect the fuses between a power supply node and a ground responsive to the first and second select signals.

According to further embodiments, the semiconductor device further includes a control circuit configured to control the first and second shift registers to support multiple fuse programming modes. The multiple fuse programming modes may include a mode wherein the fuses are programmed one at a time and at least one other mode wherein the fuses are programmed in groups comprising at least two of the fuses. The control circuit may be configured to provide a first clock signal and a first data signal to the first shift register and to provide a second clock signal and a second data signal to the second shift register. The control circuit may be configured to provide the multiple fuse programming modes by varying application of the first clock signal, the second clock signal, the first data signal and the second data signal to the first and second registers.

BRIEF DESCRIPTION OF THE DRAWINGS

The accompanying drawings are included to provide a further understanding of the inventive subject matter, and are incorporated in and constitute a part of this specification. The drawings illustrate exemplary embodiments of the inventive subject matter and, together with the description, serve to explain principles of the inventive subject matter. In the drawings.

DETAILED DESCRIPTION OF THE EMBODIMENTS

Some embodiments of the present invention will now be described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like items throughout.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. As used herein, the term "and/or" includes any and all combinations of one or more of the associated listed items and may be abbreviated as "/".

It will be understood that, although the terms first, second, etc. may be used herein to describe various items, these items should not be limited by these terms. These terms are only used to distinguish one item from another. For example, a "first" item could be termed a "second" item, and, similarly, a "second" item could be termed a "first" item without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated items or operations but do not preclude the presence or addition of one or more other items or operations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The description below is of electrical fuses (e-fuses) used as exemplary embodiments the present inventive subject matter. However, those skilled in the art can easily understand other advantages and performances of the present inventive subject matter. For example, a fuse or an anti-fuse having electrical characteristics opposite to those described herein may be programmed using operations according to some embodiments of inventive subject matter. The expression "one-time program operation" used herein refers to operations in which a program control signal (/PROG) is activated once for programming of a fuse.

Figure 1:
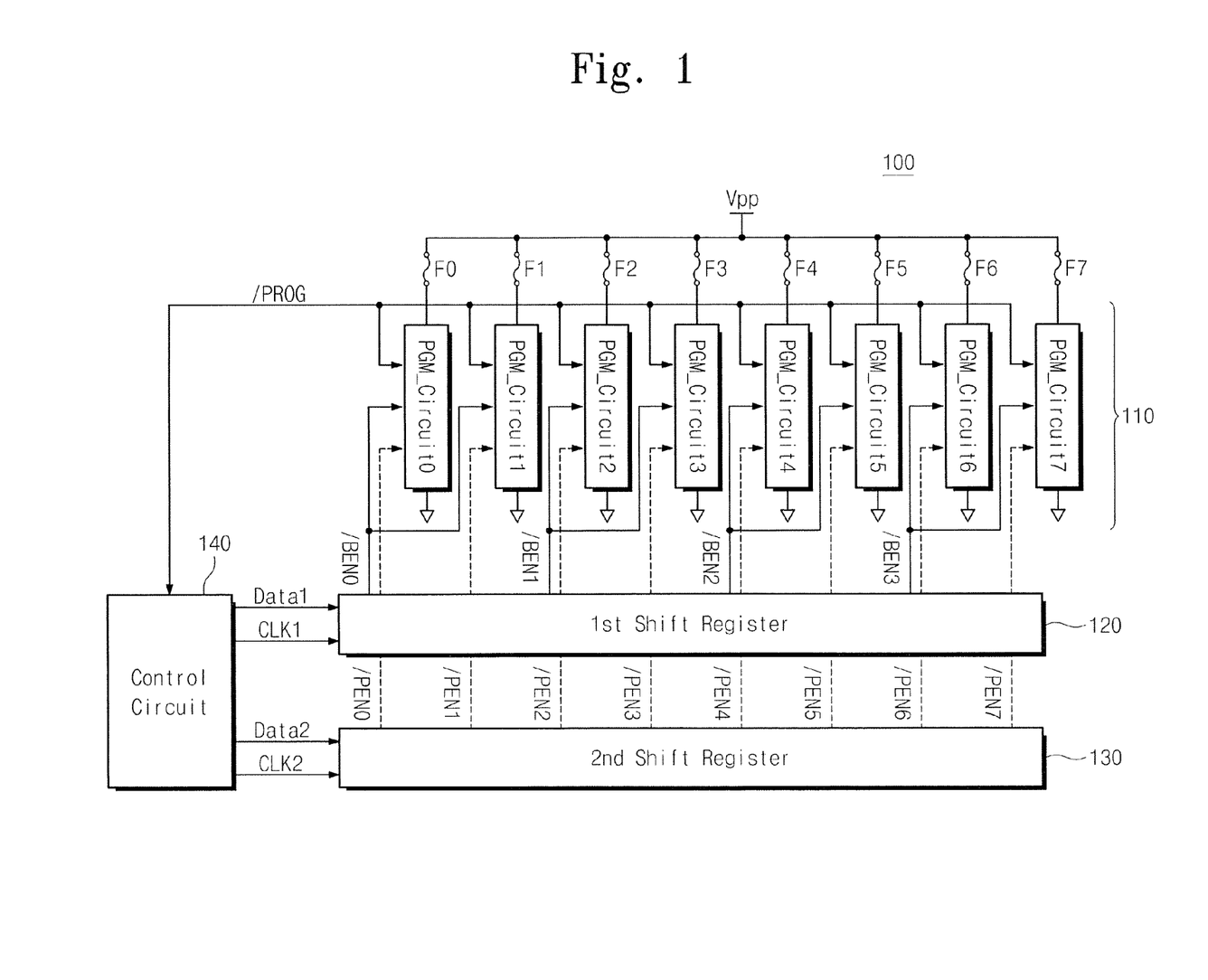
FIG. 1 is a block diagram illustrating a fuse Read Only Memory (ROM) according to some embodiments.

FIG. 1 is a block diagram schematically illustrating a fuse Read Only Memory (ROM) 100 according to some embodiments. Referring to FIG. 1, the fuse ROM 100 includes a plurality of fuses F0 to F7 and respective program circuits 110 for programming the fuses F0 to F7. The fuse ROM 100 further includes a first shift register 120 and a second shift register 130 for selecting the program circuits 110. A control circuit 140 provides data signals Data1, Data 2, clock signals CLK1, CLK2 to the shift registers 120, 130 and a program control signal /PROG to program circuits to effect multiple fuse programming modes, as described in detail below.

The fuses F0 to F7 may be simultaneously programmed using the shift registers 120, 130 according to some embodiments. In some embodiments, one or more of the fuses F0 to F7 may be programmed in one-time program operation. In particular, the number of fuses that are programmed in one-time program operation may be arbitrarily adjusted using the shift registers 120, 130.

The fuses F0 to F7 may include electric-fuses or anti-fuses. Anti-fuses may have electrical characteristics opposite to those of the e-fuses. In particular, an anti-fuse may be a resistant fuse device in which current does not flow because the anti-fuse has a very high resistance in an initial unprogrammed state. However, the anti-fuse changes to having a very low resistance after programming. An anti-fuse may have a structure in which a dielectric, such as silicon oxide, silicon nitride, tantalum oxide, or oxidized nitride oxide (ONO), is interposed between two electric conductors. Such an anti-fuse may be programmed by breaking down the dielectric between the electric conductors using a high voltage.

Each of the program circuits 110 are connected between a fuse and a ground in response to a program control signal /PROG and a select signals /BENx and /PENy, where $0 \leqq x \leqq 3$ and $0 \leqq y \leqq 7$. In particular, a program circuit PGM_Circuit0 blocks or conducts current between a fuse F0 and ground in response to the select signals /BEN0 and /PEN0 and the program control signal /PROG. If the fuse is connected to ground, current flows via the fuse F0 in responsive to a high voltage Vpp applied to one end of the fuse F0, thus blowing the fuse. Fuse program mechanisms of the respective program circuits PGM_Circuit1 to PGM_Circuit7 may be identical to the fuse program mechanism of the fuse F0. Configurations of the respective program circuits PGM_Circuit0 to PGM_Circuit7 will be described with reference to FIG. 2.

The first shift register 120 receives serial data Data1 in response to a first clock signal CLK1. The first shifter register 120 shifts the serial data Data1 to the right in synchronization with the first clock signal CLK1. The first shift register 120 responsively produced inverted data signals /BEN0, /BEN2, and /BEN3. The select signal /BEN0 controls the program circuits PGM_Circuit0 and PGM_Circuit1. The select signal /BEN1 controls the program circuits PGM_Circuit2 and PGM_Circuit3. The select signal /BEN2 controls the program circuits PGM_Circuit4 and PGM_Circuit5. The select signal /BEN3 controls s the program circuits PGM_Circuit6 and PGM_Circuit7. In other words, each of the select signals /BENx activates two adjacent program circuits.

When only one fuse is programmed in a one-time fuse program operation, the first shift register 120 is reset so that the select signals /BEN0, /BEN1, /BEN2, and /BEN3 each output a logic "L". When two or more fuses are programmed in one-time fuse program operation, the first shift register 120 sequentially shifts data at the data input Data1 in response to the first clock signal CLK1.

The second shift register 130 receives serial data Data2 in response to a second clock signal CLK2. The second shifter register 130 shifts the serial data Data2 to the right in synchronization with the second clock signal CLK2. When only 1-bit data is programmed to the fuse in one-time program operation, the second shift register 130 sequentially shifts data at the input Data2 in response to the second clock signal CLK2. When 2 or more-bit data is programmed to the fuse, the shift operation of the second shift register 130 is blocked, In particular, the second shift register 130 receives and loads all data in an initial operation, and outputs program control signals /PEN0 to /PEN7 corresponding to the loaded data.

In the fuse ROM 100, program operations are controlled through control of data input to the first and second shift registers 120, 130 and shift operations applied thereto. In particular, if one 1-bit data is programmed in one-time program operation, the first shift register 120 activates all the program control signals /BEN0, /BEN1, /BEN2, and /BEN3. The program circuits are sequentially activated by a shift operation of the data Data2 input to the second shift register 130 in synchronization with the second clock signal CLK2. In this case, a fuse corresponding to a program circuit activated according to logic of a program control signal /PROG is blown or maintained.

When 2 or more bit data is programmed to the fuse, all the program data are input to the second shift register 130. Depending on shift operations of the first shift register 120, the program control signals /PEN0 to /PEN7 may be selected in units of 2-bits, 4-bits, 6-bits and 8-bits. The number of bits that are programmed in one-time program operation can be controlled according to the shift operation of the first and second shift registers 120, 130.

Figure 2:
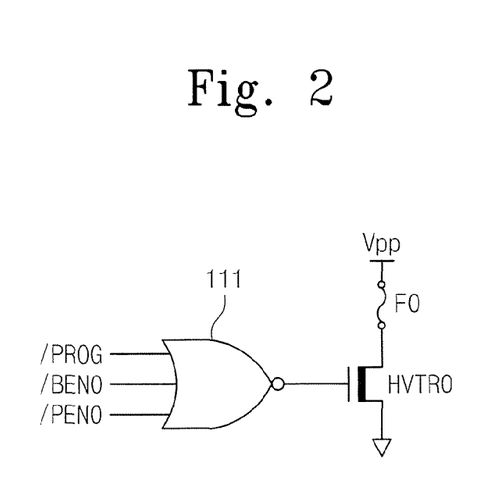
FIG. 2 is a circuit diagram illustrating an implementation of a program circuit shown in FIG. 1.

FIG. 2 is a circuit diagram illustrating an exemplary configuration of a program circuit PGM_Circuit0 shown in FIG. 1. Referring to FIG. 2, the program circuit PGM_Circuit0 for programming a fuse F0 includes a NOR gate 111 and a high-voltage transistor HVTR0.

The NOR gate 111 receives program control signal /PROG and select signals /BEN0 and /PEN0. If at least one of the program control signal /PROG and select signals /BEN0 and /PEN0 is a logic "H", the high-voltage transistor HVTR0 blocks current flow through the fuse F0. The high-voltage transistor HVTR0 is turned on only when the program control signal /PROG and the select signals /BEN0 and /PEN0 are all logic "L".

When the high-voltage transistor HVTR0 is turned on, current flows in the fuse F0, which is blown by the current. The same programming mechanism is used in the other program circuits PGM_Circuit1 to PGM_Circuit7.

Figure 3:
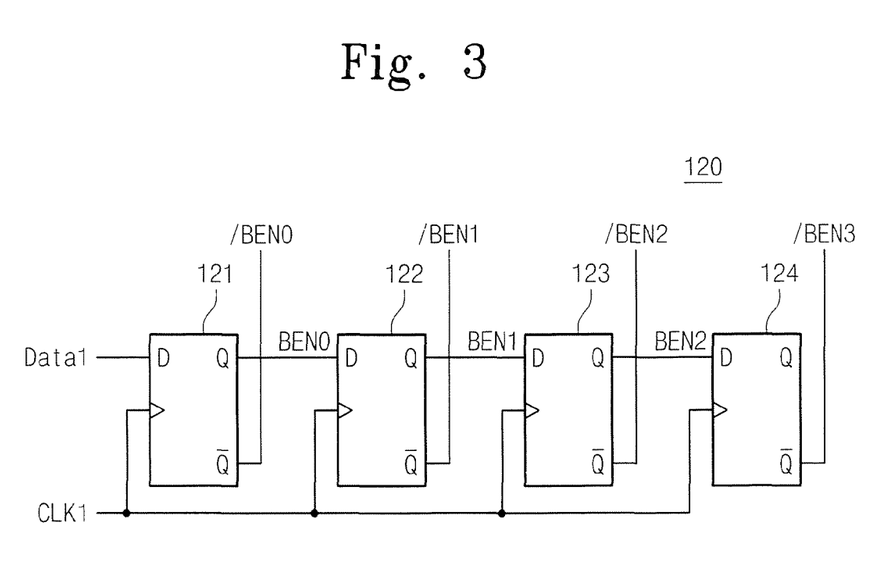
FIG. 3 is a circuit diagram illustrating an implementation of a first shift register shown in FIG. 1.

FIG. 3 is a block diagram illustrating an implementation of the first shift register 120 shown in FIG. 1. Referring to FIG. 3, the first shift register 120 shifts Data1 input in response to the first clock signal CLK1 through series of flip-flops (F/F) 121 through 124.

The flip-flop 121 outputs the select signal /BEN0 for controlling the program circuits PGM_Circuit0 and PGM_Circuit1. The select signal /BEN0 is provided as an inverted output /Q of the data at the input D of the flip-flop 121. The flip-flop 122 outputs the select signal /BEN1 for controlling the program circuits PGM_Circuit2 and PGM_Circuit3. The select signal /BEN1 is provided as an inverted output /Q of the data input at the input D of the flip-flop 122. The flip-flop 123 outputs the select signal /BEN2 for controlling the program circuits PGM_Circuit4 and PGM_Circuit5. The select signal /BEN2 is provided as an inverted output /Q of data input to the input D of the flip-flop 123. The flip-flop 124 outputs the select signal /BEN3 for controlling the program circuits PGM_Circuit6 and PGM_Circuit7. The select signal /BEN3 is provided as an inverted output /Q of data input to the input D of the flip-flop 124.

Figure 4:
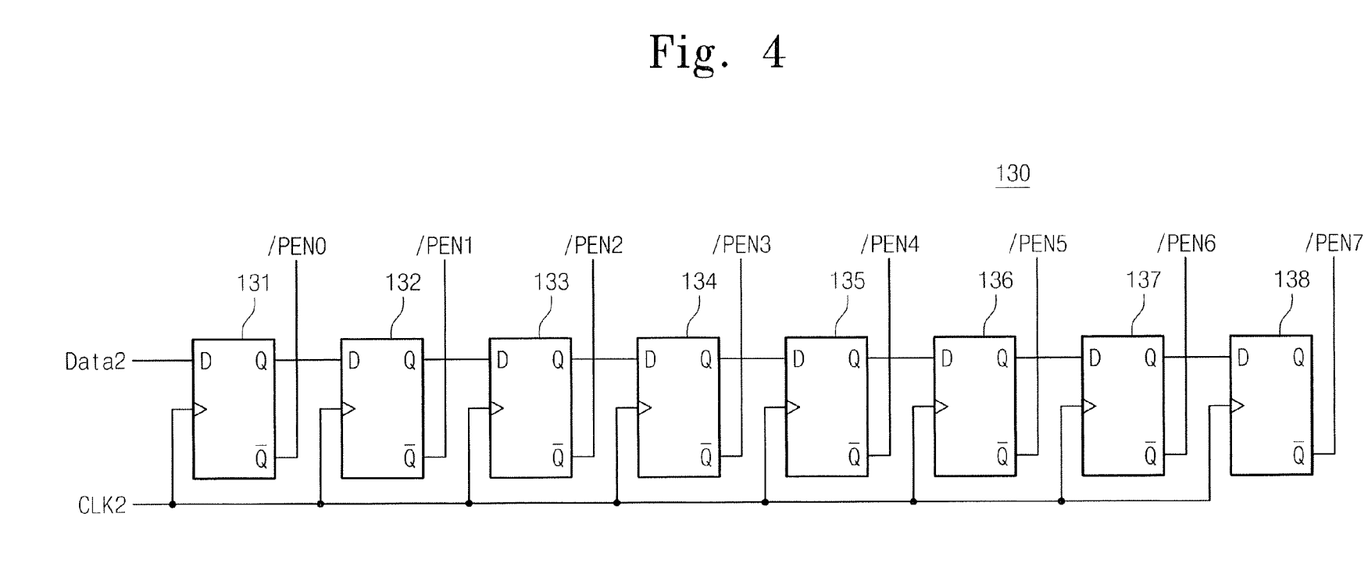
FIG. 4 is a circuit diagram illustrating an implementation of a second shift register shown in FIG. 1.

FIG. 4 is a block diagram illustrating an implementation of the second shift register 130 of FIG. 1. Referring to FIG. 4, the second shift register 130 shifts Data2 input in response to the first clock signal CLK1 through series of flip-flops (F/F) 131 through 138.

The flip-flop 131 provides a select signal /PEN0 for controlling the program circuit PGM_Circuit0. The flip-flop 132 provides a select signal /PEN1 for controlling the program circuit PGM_Circuit1. The flip-flop 133 provides a select signal /PEN2 for controlling the program circuit PGM_Circuit2. The flip-flop 134 provides a select signal /PEN3 for controlling the program circuit PGM_Circuit3. The flip-flop 135 provides a select signal /PEN4 for controlling the program circuit PGM_Circuit4. The flip-flop 136 provides a select signal /PEN5 for controlling the program circuit PGM_Circuit5. The Clip-flop 137 provides a select signal /PEN6 for controlling the program circuit PGM_Circuit6. The flip-flop 138 provides a select signal /PEN7 for controlling the program circuit PGM_Circuit7.

The second shift register 130 is operated as a shift register when 1-bit programming is performed in a one-time program operation. However, the second shift register 130 serves as a buffer when 2 or more-bit data is programmed in one-time program operation.

Although it has been described in FIGS. 3 and 4 that the first and second shift registers 120, 130 are configured using D-flip-flops, the above configuration is merely illustrated as an example for purposes of explanation, and embodiments are not limited thereto.

Figure 5:
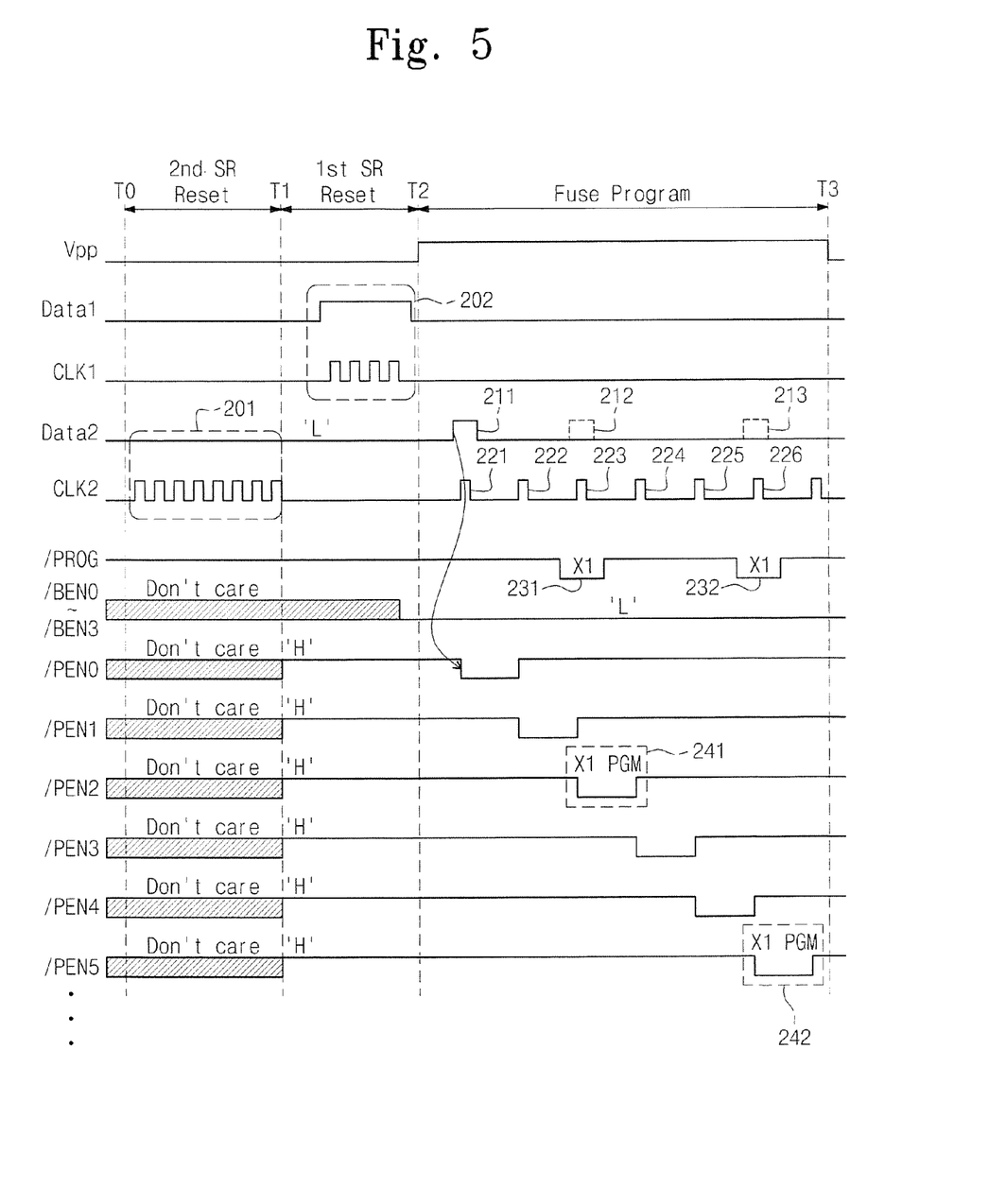
FIG. 5 is a timing diagram illustrating operations for programming 1-bit data.

FIG. 5 is a timing diagram illustrating operations for programming the fuse ROM 100 of FIG. 1 according to some embodiments. Referring to FIG. 5, 1-bit data is written in one-time program operations. The write operations may be divided into a reset period T0 to T1 of the second shifter register 130, a reset period T1 to T2 of the first shifter register 120, and a programming period T2 to T3 of selected fuses.

During the reset period T0 to T1 of the second shift register 130, all the flip-flops in the second shift register 130 are reset to a logic "L". In particular, during the reset period T0 to T1 of the second shift register 130, the outputs Q of the flip-flops 131 to 138 are reset to logic "L" by setting data Data2 to logic "L" and toggling the second clock signal CLK2 eight times (operations 201 in FIG. 5). Select signals /PEN0 to /PEN7 output from the flip-flops 131 to 138 are thus reset to logic "H". Although it has been described that the data Data2 and the second clock signal CLK2 are used for the reset operations of the second shift register 130, the reset operation may also be implemented by setting respective reset or set terminals of the flip-flops.

During the reset period T1 to T2 of the first shift register 120, all the flip-flops of the first shift register 120 are configured to have an output state of logic "H". In particular, during the reset period T1 to T2 of the first shift register 120, the output Q of the flip-flops 121 to 124 are reset to logic "H" by setting data Data1 to logic "H" and toggling the first clock signal CLK1 four times (operations 202 in FIG. 5). Select signals /BEN0 to /BEN3 output from first shift register 120 are thus driven to logic "L" even in the fuse program period T2 to T3. Although it has been described that the data Data1 and the first clock signal CLK1 are used for the reset operation of the first shift register 120, the reset operation may be implemented by setting respective reset or set terminals of the flip-flops.

During the fuse program period T2 to T3, a fuse to be programmed is selected through input of data 211 to the reset second shift register 130 and shifts 212, 213 of the input data 211. The first shift register 120 is blocked from input of clock and data during the fuse program period T2 to T3. Accordingly, the select signal /BEN0 to /BEN3 are fixed to logic "L" during the fuse program period T2 to T3. As described above, a fuse is programmed when all inputs to the corresponding program circuit are logic "L". Since all the select signal /BEN0 to /BEN3 are logic "L", a corresponding fuse is programmed if the program control signal /PROG and the select signal /PENy are simultaneously set to logic "L".

The data Data2 is input through the second shift register 130 (operations 211), and shifted by toggling the second clock signal CLK2. The select signals /PEN0 to /PENT are sequentially toggled to logic "L". If the fuse F2 and fuse F5 are intended to be programmed, the program control signal /PROG is driven to a logic "L" in synchronization with the third and sixth logic "H" periods 223, 226 of the second clock signal CLK2. One fuse may be programmed for each logic "L" pulse of the program control signal /PROG.

Figure 6:
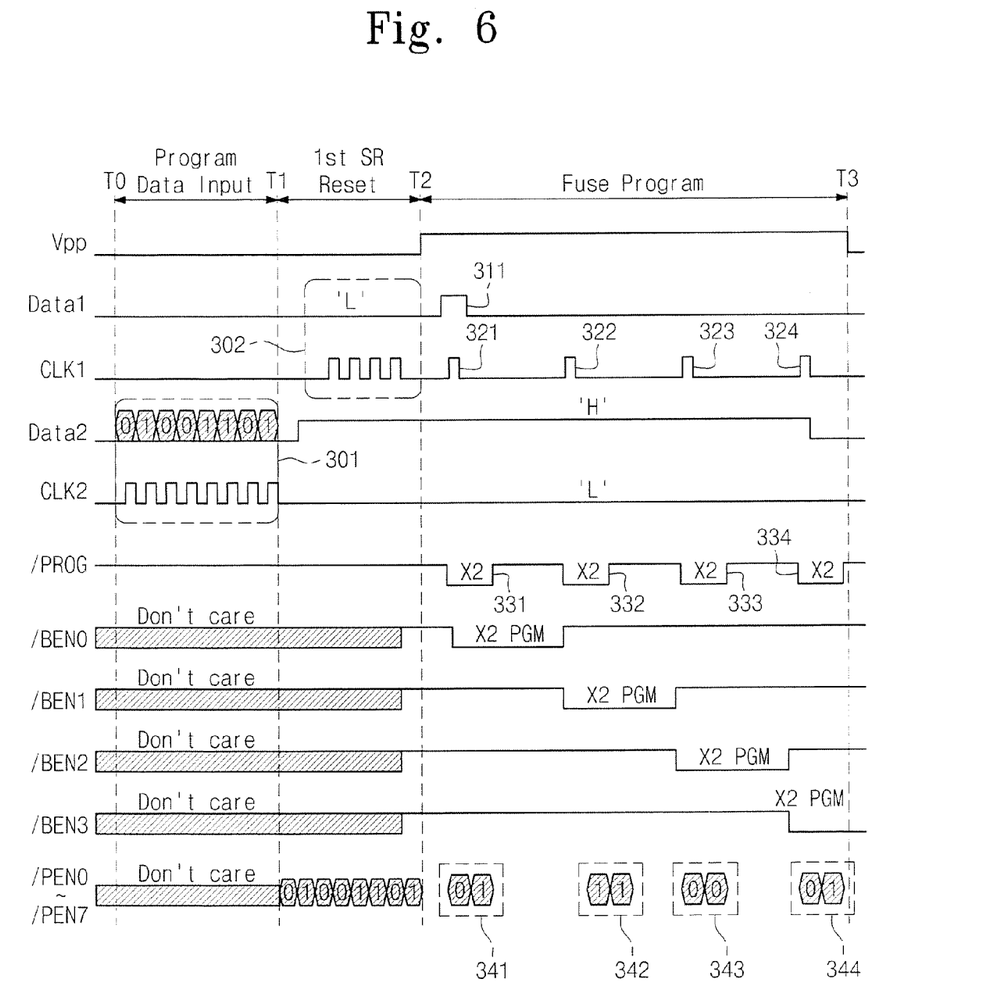
FIG. 6 is a timing diagram illustrating operations for programming 2-bit data.

FIG. 6 is a timing diagram illustrating operations for programming a fuse ROM 100 according to further embodiments. Referring to FIG. 6, 2-bit data is simultaneously written in a one-time program operation. The write operations may be divided into a program data input period T0 to T1 for the second shifter register 130, a reset period T1 to T2 for the first shifter register 120, and a programming period T2 to T3 for selected fuses.

During the program data input period T0 to T1, all data to be programmed to fuses F0 to F7 are input to the second shift register 130. The program data are in series input in synchronization with the second clock signal CLK2. If data to be programmed to the fuses is [01001101], 8-bit data [01001101] is input to the second shift register 130 in synchronization with the second clock signal CLK2. This operation is shown by a reference numeral 301 in FIG. 6. After the 8-bit data [01001101] is input, input data Data2 of the second shift register 130 is fixed to logic "H".

If the input of the program data is completed through the second shift register 130, the first shift register 120 is reset. The first shift register 120 is reset to logic "L" during the reset period T1 to T2. Unlike FIG. 5, all the flip-flops of the first shift register 120 are reset to logic "L". In particular, during the reset period T1 to T2 of the first shift register 120, the outputs Q of the flip-flops 121 to 124 are reset to logic "L" if data Data1 is fixed to logic "L" and the first clock signal CLK1 is toggled four times (operations 302). Subsequently, select signals /BEN0 to /BEN3 output from first shift register 120 are set to logic "H" before the fuse program period T2 to T3.

In the fuse program period T2 to T3, data 311 input to the first shift register 120 is shifted through respective flip-flops (121 to 124 of FIG. 3) of the first shift register 120 in synchronization with the first clock signal CLK1. Although it has been described that the data Data1 and the first clock signal CLK1 are used for the reset operation of the first shift register 120, the reset operation may be implemented by setting respective reset or set terminals of the flip-flops.

The fuse program period T2 to T3 is a period in which a fuse to be programmed is selected based on the data 311 previously loaded into the second shift register 130. The clock signal CLK2 and data Data2 of the second shift register 130 is blocked during the fuse program period T2 to T3. The second shift register 130 maintains the input program data [01001101], and provides the program data to program circuits 110 through select signals /PEN0 to /PEN7.

During the fuse program period T2 to T3, the select signals /PEN0 to /PEN7 provided from the second shift register 130 are fixed. However, the select signals /BEN0 to /BEN3 output from the first shift register 120 change according to shifted positions of the data (logic "H") input for the first time after the reset. In particular, the select signals /BEN0 to /BEN3 sequentially transition to logic "L" according to shifted positions of the data 311 input in synchronization with the first clock signal CLK1, 321. If the program control signal /PROG is activated to logic "L", two program circuits selected by the respective select signals /BEN0 to /BEN3 are activated.

For example, the select signal /BEN0 is activated to logic "L" at the point where the data Data1 is input as logic "H" for the first time. If the program control signal /PROG is activated to logic "L" (331), the program circuits PGM_Circuit0 and PGM_Circuit1 are activated. Accordingly, data [01] 310 is programmed to the fuses F0 and F1 according to values of the select signals /PEN0 and /PEN1. In particular, the first shift register 120 selects two program circuits sequentially. In a one-time program operation, the program data output from the second shift register 130 may be programmed in 2-bit units through the first shift register 120. In such 2-bit unit programming, values [11] 342, [00] 343, and [01] 344 are programmed by the pulses 322, 323, 324 of the clock signal CLK1, respectively.

Operations for programming fuses in 2-bit units in a one-time program operation and procedures thereof have been described above. For the 2-bit unit fuse programming operations, a program data input period T1 to T1 for the second shift register 130 and a first shift register reset period T1 to T2 performed. Subsequently, groups of two program circuits are sequentially selected by the shift operation of the first shift register 120. According to this operation, the program data may be programmed two fuses at a time.

Figure 7:
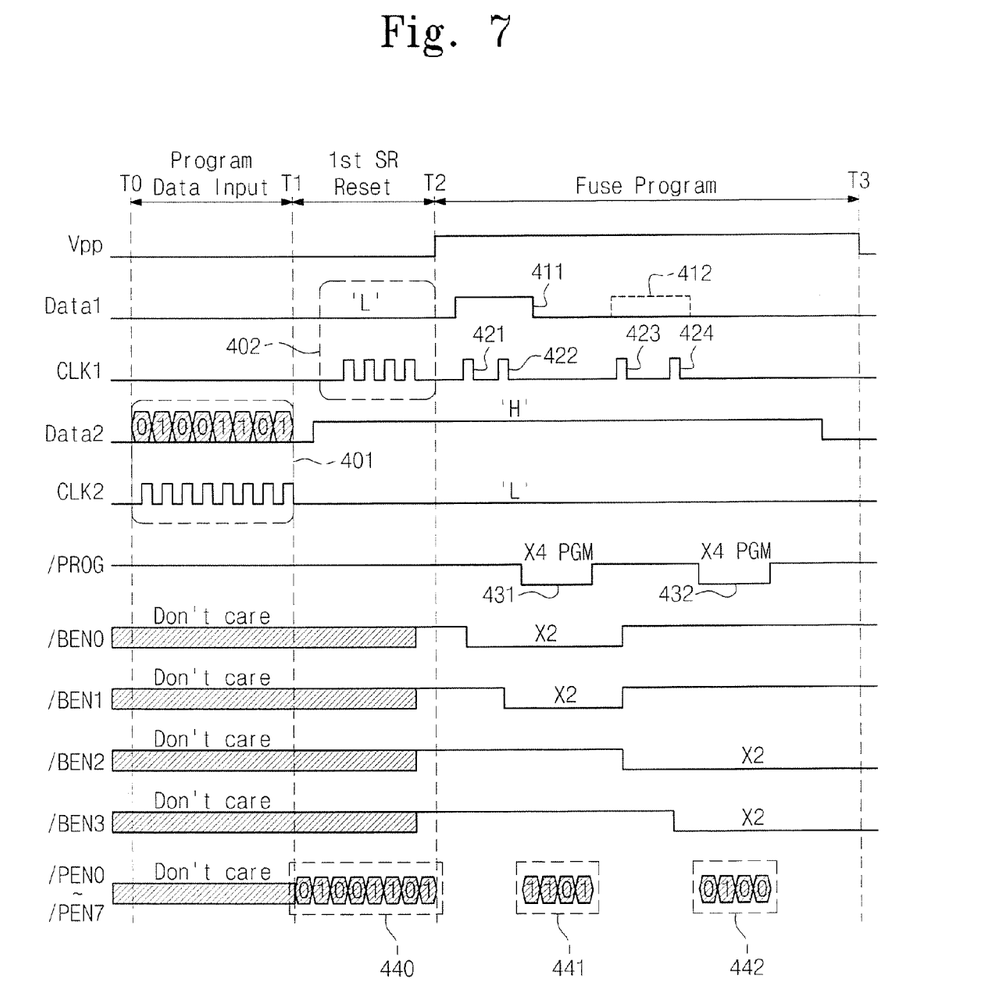
FIG. 7 is a timing diagram illustrating operations for programming 4-bit data.

FIG. 7 shows operations for performing 4-bit programming according to further embodiments. Referring to FIG. 7, write operations may be divided into a program data input period T0 to T1 for the second shifter register 130, a reset period T1 to T2 for the first shifter register 120, and a programming period T2 to T3 for selected fuses.

During the program data input period T0 to T1, data to be programmed to fuses F0 to F7 are input to the second shift register 130. The program data are input serially in synchronization with the second clock signal CLK2. If data to be programmed to the fuses is [01001101], 8-bit data [01001101] is input to the second shift register 130 in synchronization with the second clock signal CLK2 (operations 401). After the 8-bit data [01001101] is input, input data Data2 of the second shift register 130 is set to logic "H".

If the input of the program data is completed through the second shift register 130, the first shift register 120 is reset. The first shift register 120 is reset to logic "L" during the reset period T1 to T2. In particular, during the reset period T1 to T2, the outputs Q of the flip-flops 121 to 124 are reset to logic "L" if data Data1 is set to logic "L" and the first clock signal CLK1 is toggled four times (operations 402). Subsequently, select signals /BEN0 to /BEN3 output from first shift register 120 are fixed to logic "H" in the fuse program period T2 to T3. In the fuse program period T2 to T3, data Data1 provided to the first shift register 120 are shifted to respective flip-flops thereof in synchronization with pulses 421, 422, 423, and 424 of the first clock signal CLK1 (see reference numeral 412). Although it has been described that the data Data1 and the first clock signal CLK1 are used for the reset operation of the first shift register 120, the reset operation may be implemented by setting respective reset or set terminals of the flip-flops.

The fuse program period T2 to T3 is a period in which fuses to be programmed are selected based on data 311 input to and shifted through the reset second shift register 130. Input of the clock signal and data of the second shift register 130 is blocked during the fuse program period T2 to T3. The second shift register 130 maintains the input program data [01001101], and provides the program data to program circuits 110 through select signals /PEN0 to /PEN7.

During the fuse program period T2 to T3, the select signals /PEN0 to /PEN7 are fixed. However, the select signals /BEN0 to /BEN3 output from the first shift register 120 change as data 411 (logic "H") is shifted. In particular, the flip-flops 121 and 122 are set to logic "H" by the data 411 input in synchronization with pulses 421, 422 of the first clock signal CLK1. In this case, the select signals /BEN0 and /BEN1 simultaneously transition to logic "L". If the program control signal /PROG is activated to logic "L" (operation 431), four program circuits PGM_Circuit0 to PGM_Circuit3 selected by the respective select signals /BEN0 and /BEN1 are activated.

Data [1101] 441 is programmed to fuses F0 to F3 according to the select signals /PEN0 to /PEN3. In particular, the first shift register 120 selects four program circuits sequentially. In a one-time program operation, the program data output from the second shift register 130 may be programmed in 4-bit units through the first shift register 120. Data [0100] 442 may be programmed to fuses F4 to F7 by the above technique.

Operations for programming fuses in 4-bit units have been described above. For the 4-bit unit fuse programming operations, the program data input period T0 to T1 for the second shift register 130 and the first shift register reset period T1 to T2 for sequentially selecting two program circuits at one time are performed. Subsequently, groups of four program circuits are sequentially selected through the shift operation of the input data in the first shift register 120, 6-bit or 8-bit unit fuse programming may be performed in similar ways.

Figure 8:
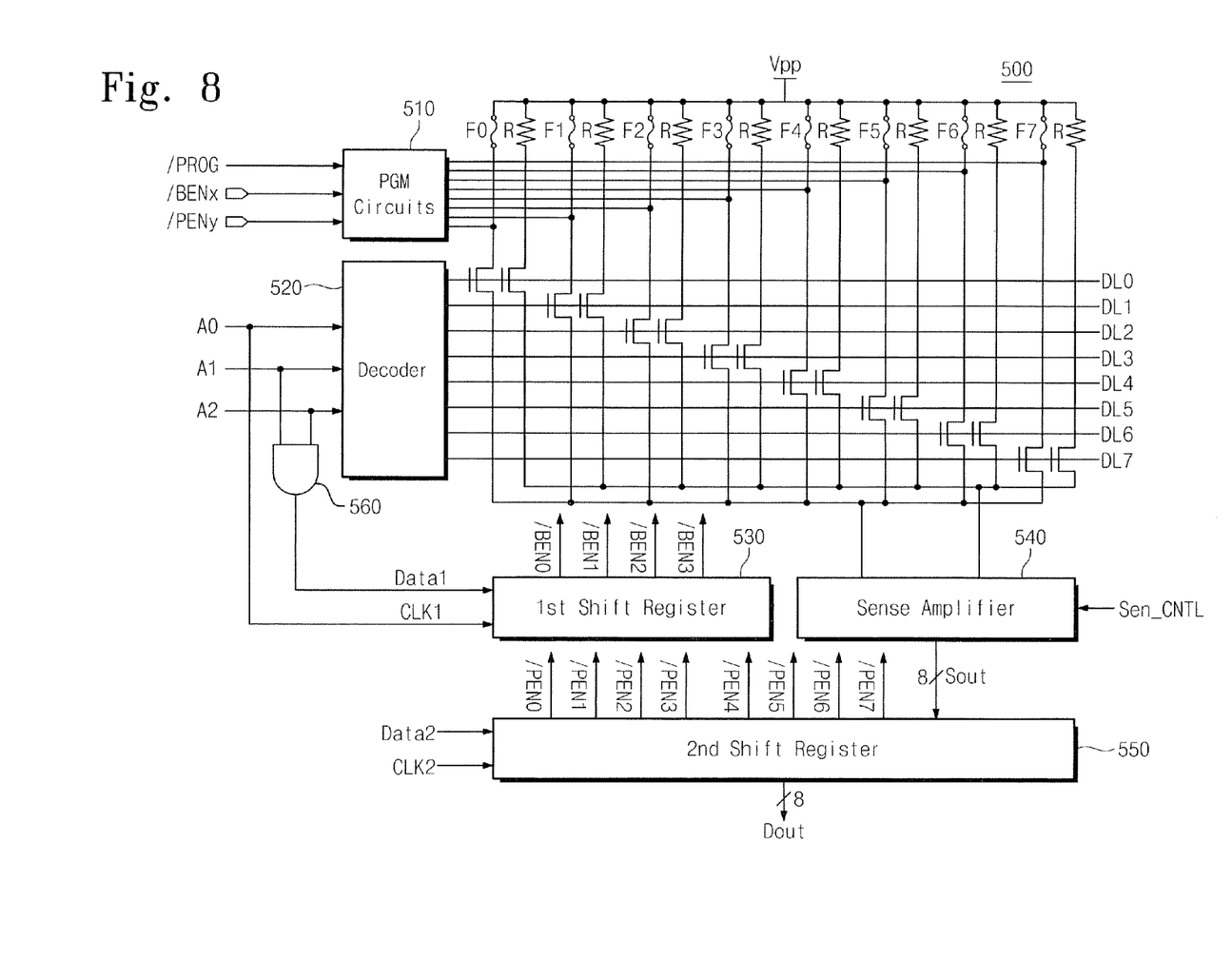
FIG. 8 is a block diagram illustrating a fuse ROM according to further embodiments.

FIG. 8 is a circuit diagram illustrating an exemplary fuse ROM 500 according to further embodiments of the inventive subject matter. Referring to FIG. 8, the fuse ROM 500 includes a plurality of fuses F0 to F7 and a group of program circuits 510 that program the fuses F0 to F7. The fuse ROM 500 includes a first shift register 530 and a second shift register 550 that select the program circuit 510. The fuse ROM 500 further includes a decoder 520 and a sense amplifier 540 that provide programmed data.

The plurality of fuses F0 to F7 may be individually or simultaneously programmed in groups by selectively operation of the shift registers 530 and 550. In particular, the number of fuses programmed in one-time program operations may be arbitrarily adjusted by the shift registers 530 and 550. The fuses F0 to F7 are paired with resistors R to provide a reference for sensing operations.

The fuses F0 to F7 may include electrical fuses (e-Fuse) or anti-fuses. When the fuses F0 to F7 include anti-fuses, complementary logic values may be used in comparison to electrical fuses. The program circuits 510 connect fuses to a ground in response to a program control signal /PROG and a select signals /BENx and /PENy (where $0 \leq x \leq 3$, and $0 \leq y \leq 7$). The plurality of fuses F0 to F7, the program circuits 510 and the first and second shift registers 530 and 550 may be configured along the lines described above with reference FIGS. 1 through 4.

The decoder 520 selects fuse-resistor pairs in response to an address A[2:0]. In particular, the decoder 520 drives decoder lines DL0 to DL7 corresponding to the input address.

An input of the first shift register 530 may be provided using the address provided to the decoder 520. Data Data1 of the first shift register 530 described above may be provided to AND logic of A1 and A2 among address bits. A first clock signal CLK1 may be provided through A0 among the address bits. Using such a configuration, fuse programming may be performed without an additional circuit for setting the first shift register 530.

The sense amplifier 540 senses fuse data selected by the decoder 520 in response to a sensing control signal Sen_CNTL and outputs the selected fuse data to the second shift register 550. The second shift register 550 is used as a buffer providing program data upon fuse program operation. However, the second shift register 550 may also serve as an output buffer for outputting the sensed data upon read operation of the fuse data. The second shift register 550 temporarily stores sensed data Sout output from the sense amplifier 540, and outputs it as output fuse data Dout.

Operations of the plurality of fuses F0 to F7 may be similar to those described above. The fuse ROM 500 can program fuses in various ways using data input to the first and second shift registers 530 and 550. In particular, the number of bits programmed in one-time program operation can be adjusted by changing values of program vectors input upon fuse program operation. Also, the speed of the fuse program may be varied by changing the values of the program vectors input during fuse program operations.

The fuse ROM may be mounted using various forms of packages. For example, the fuse ROM may be mounted using packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip on Board (COB), Ceramic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System in Package (SIP), Multi Chip Package (MCP), Wafer-level Fabricated Package (WFP), and Wafer-level Processed Stack Package (WSP).

According to embodiments, a fuse ROM can be provided to adjust the size and method of simultaneously programmed data using only a change of a program vector.

The above-disclosed subject matter is to be considered illustrative and not restrictive, and the appended claims are intended to cover all such modifications, enhancements, and other embodiments, which fall within the true spirit and scope of the inventive subject matter. Thus, to the maximum extent allowed by law, the scope of the inventive subject matter is to be determined by the broadest permissible interpretation of the following claims and their equivalents, and shall not be restricted or limited by the foregoing detailed description.

What is claimed is:

1. A semiconductor device comprising:
a plurality of fuses;
a plurality of program circuits, respective ones of which are configured to program respective ones of the plurality of fuses;
a first shift register configured to generate first select signals, respective ones of which are applied to respective groups of the program circuits, each of the groups comprising at least two program circuits;
a second shift register configured to generate second select signals, respective ones of which are applied to respective ones of the program circuits; and
a control circuit configured to control the first and second shift registers.

2. The semiconductor device of claim 1, wherein the plurality of program circuits are configured to program the plurality of fuses in response to the first select signals, the second select signals and a program control signal.

3. The semiconductor device of claim 1, wherein the control circuit is configured to cause the first shift register to assert all of the first select signals to enable fuse programming by the program circuits and to cause the second shift register to selectively assert the second select signals in sequence responsive to data shifted therethrough to selectively program the fuses one at a time.

4. The semiconductor device of claim 1, wherein the control circuit is configured to cause the first shift register to shift data input thereto to selectively assert the first select signals in sequence to program the fuses at least two at a time.

5. The semiconductor device of claim 4, wherein the control circuit is configured to load a sequence of data into the second shift register prior to shifting data through the first shift register and to maintain the loaded data in the second shift register during shifting of data through the first shift register.

6. The semiconductor device of claim 1, wherein the control circuit comprises:
a decoder configured to select one of the fuses in response to address signals; and
a sense amplifier configured to sense data stored in the one selected fuse.

7. The semiconductor device of claim 6, wherein two of the address signals comprise an input data signal and a clock signal provided to the first shift register.

8. A semiconductor device comprising:
a plurality of fuses;
a first shift register configured to generate a plurality of first select signals;
a second shift register configured to generate a plurality of second select signals;
a plurality of program circuits, respective pairs of which are configured to receive respective ones of the first select signals and respective ones of which are configured to receive respective ones of the second select signals and configured to program respective ones of the fuses responsive thereto.

9. The semiconductor device of claim 8, where the program circuits are configured to selectively conduct program current through the fuses responsive to the first and second select circuits signals.

10. The semiconductor device of claim 9, wherein the program circuits are configured to selectively connect the fuses between a power supply node and a ground responsive to the first and second select signals.

11. The semiconductor device of claim 8, further comprising a control circuit configured to control the first and second shift registers to support multiple fuse programming modes in which different numbers of fuses are simultaneously programmed.

12. The semiconductor device of claim 11, wherein the multiple fuse programming modes comprise a mode wherein the fuses are programmed one at a time and at least one other mode wherein the fuses are programmed in groups comprising at least two of the fuses.

13. The semiconductor device of claim 11, wherein the control circuit is configured to provide a first clock signal and a first data signal to the first shift register and to provide a second clock signal and a second data signal to the second shift register.

14. The semiconductor device of claim 13, wherein the control circuit is configured to provide the multiple fuse programming modes by varying application of the first clock signal, the second clock signal, the first data signal and the second data signal to the first and second registers.

* * * * *